United States Patent
Chang et al.

(10) Patent No.: US 7,569,432 B1
(45) Date of Patent: Aug. 4, 2009

(54) METHOD OF MANUFACTURING AN LED

(75) Inventors: Liann-Be Chang, Dasi Township, Taoyuan County (TW); Shiue-Ching Chiuan, Wurih Township, Taichung County (TW); Kuo-Ling Chiang, Taoyuan (TW)

(73) Assignee: Chang Gung University, Tao-Yuan (TW)

( * ) Notice: Subject to any disclaimer, the term of this patent is extended or adjusted under 35 U.S.C. 154(b) by 0 days.

(21) Appl. No.: 12/013,687

(22) Filed: Jan. 14, 2008

(51) Int. Cl.
*H01L 21/20* (2006.01)
(52) U.S. Cl. .................. 438/141; 438/91; 438/602; 257/E21.053; 257/E21.126; 257/E21.127; 257/E21.352
(58) Field of Classification Search .................. 438/91, 438/141, 513, 602, 603, 604, 606, 608, 650, 438/686
See application file for complete search history.

(56) References Cited

U.S. PATENT DOCUMENTS

| | | | | |
|---|---|---|---|---|
| 6,900,472 B2* | 5/2005 | Kondoh et al. | ................ | 257/94 |
| 7,279,347 B2* | 10/2007 | Hon et al. | ..................... | 438/29 |
| 7,358,539 B2* | 4/2008 | Venugopalan et al. | ......... | 257/98 |
| 2002/0117672 A1* | 8/2002 | Chu et al. | ..................... | 257/79 |
| 2008/0265265 A1* | 10/2008 | Xiong et al. | .................. | 257/97 |

* cited by examiner

*Primary Examiner*—David Nhu
(74) *Attorney, Agent, or Firm*—Alan Kamrath; Kamrath & Associates PA

(57) ABSTRACT

A method of manufacturing an LED of high reflectivity includes forming a substrate; depositing an n-type GaN layer on the substrate; depositing an active layer on a first portion of the n-type GaN layer; attaching an n-type metal electrode to a second portion of the n-type GaN layer; depositing a p-type GaN layer on the active layer; forming a metal reflector on the p-type GaN layer; attaching a p-type metal electrode to the metal reflector; and attaching the p-type metal electrode and the n-type metal electrode to an epitaxial layer respectively. The metal reflector includes a transparent layer, an Ag layer, and an Au layer. The transparent layer and the Ag layer are formed by annealing in a furnace, and the Au layer is subsequently coated on the Ag layer.

7 Claims, 10 Drawing Sheets

METHOD OF MANUFACTURING AN LED

BACKGROUND OF THE INVENTION

1. Field of Invention

The invention relates to LED (light-emitting diode) manufacturing, particularly, to a method of manufacturing an LED of high reflectivity, and, more particularly, to a method of manufacturing an LED having a metal reflector including an Au layer coated on an Ag layer thereof after annealing.

2. Description of Related Art

A conventional LED is schematically shown in FIG. 8. The LED comprises a substrate 51, an n-type GaN (gallium nitride) layer 52 deposited on the substrate 51, an active layer 54 deposited on a portion of the n-type GaN layer 52, an n-type metal electrode 55 on another portion of the n-type GaN layer 52, a p-type GaN layer 53 deposited on the active layer 54, and a p-type metal electrode 56 on the p-type GaN layer 53.

The above conventional LED has a low light emission efficiency.

Another conventional method of manufacturing an LED is schematically shown in FIG. 9. A produced LED is formed on an n-GaN based epitaxial layer 40. The LED comprises a metal reflector 36 including an upper Ni (nickel) layer 361, an intermediate Ag (silver) layer 362, and a lower Au (gold) layer 363 stacked together in which the upper Ni layer 361 functions as an adhesive and the Ag layer 362 acts for reflecting light, A p-type metal electrode 35 electrically interconnects the Au layer 363 and the n-GaN based epitaxial layer 40. A p-type GaN layer 33 is deposited on the metal reflector 36 to be electrically connected to the p-type metal electrode 35 through the Au layer 363. An active layer 37 is deposited on the p-type GaN layer 33. An n-type GaN layer 32 is deposited on the active layer 37. An n-type metal electrode 34 electrically interconnects the n-type GaN layer 32 and the n-GaN based epitaxial layer 40, A substrate 31 is deposited on the n-type GaN layer 32.

The Ni, Ag, and Au layers 361, 362, and 363 are annealed in a furnace to form the metal reflector 36 which is adhered to the p-type GaN layer 33.

Light emitted from the active layer 37 impinges on the metal reflector 36 prior to reflecting to the active layer 37. Thus, the metal reflector 36 of high reflectivity can increase the light emission efficiency of the LED.

However, the Au layer 363 tends to melt and, thus, permeates the Ag layer 362 in the annealing process. This can decrease reflectivity of the Ag layer 362, resulting in a decrease of the light emission efficiency of the LED.

In addition, there have been numerous suggestions in prior patents for the manufacturing of an LED. For example, U.S. Pat. No. 7,279,347 discloses a method for manufacturing a light-emitting structure of a light-emitting device (LED).

Thus, it is desirable to provide a novel method of manufacturing an LED in order to overcome the inadequacies of the prior art.

SUMMARY OF THE INVENTION

It is therefore one object of the invention to provide a method of manufacturing an LED of high reflectivity.

To achieve the above and other objects, the invention provides a method of manufacturing an LED including forming a substrate; depositing an n-type GaN layer on the substrate; depositing an active layer on a first portion of the n-type GaN layer; attaching an n-type metal electrode to a second portion of the n-type GaN layer; depositing a p-type GaN layer on the active layer; forming a metal reflector on the p-type GaN layer; attaching a p-type metal electrode to the metal reflector; and attaching the p-type metal electrode and the n-type metal electrode to an epitaxial layer respectively. The metal reflector comprises a transparent layer, an Ag layer, and an Au layer, the transparent layer and the Ag layer are formed by annealing in a furnace, and the Au layer is subsequently coated on the Ag layer.

The above and other objects, features and advantages of the invention will become apparent from the following detailed description taken with the accompanying drawings.

DETAILED DESCRIPTION OF THE INVENTION

Figure 1:
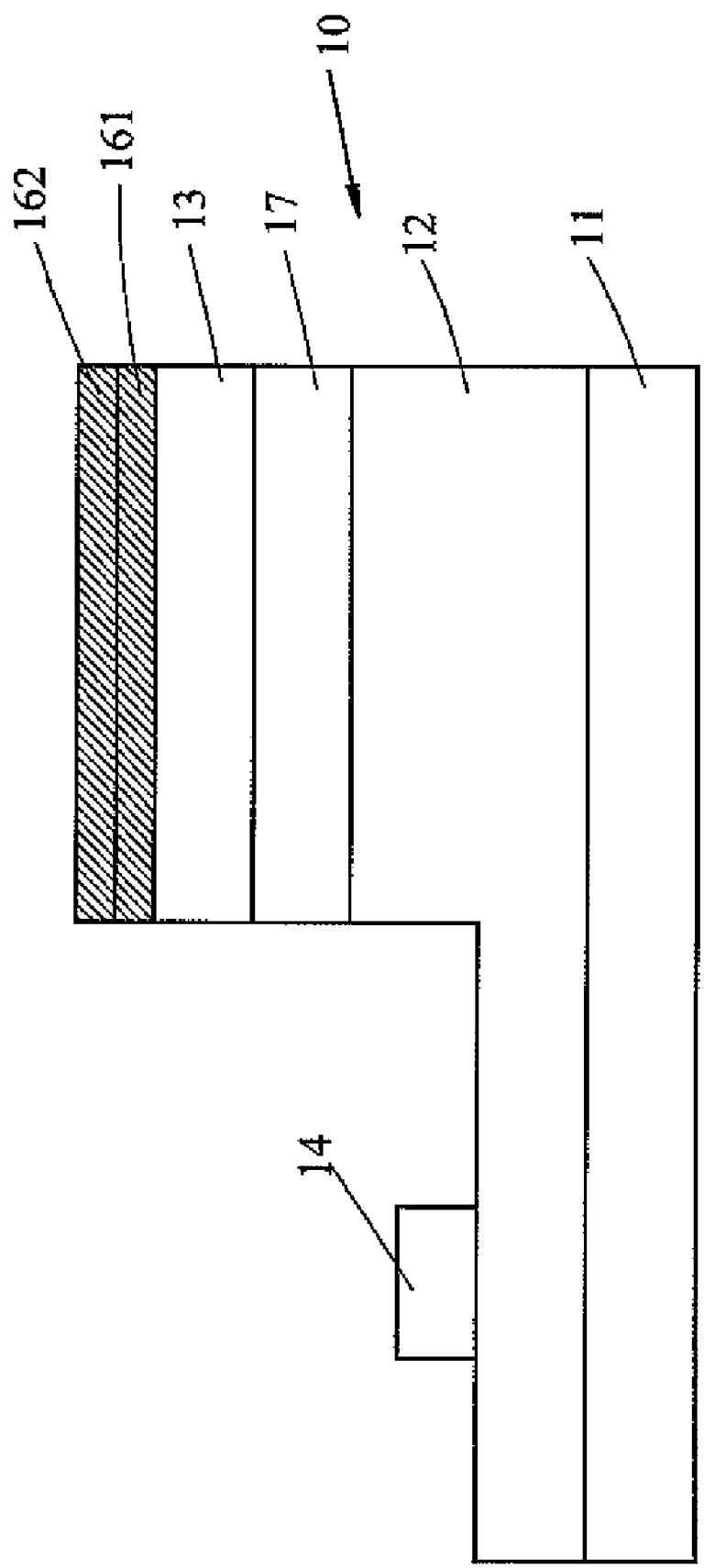
FIG. 1 is a schematic sectional view of an LED being manufactured in a first step of a method according to the invention where a transparent layer and an Ag layer are formed.
Figure 2:
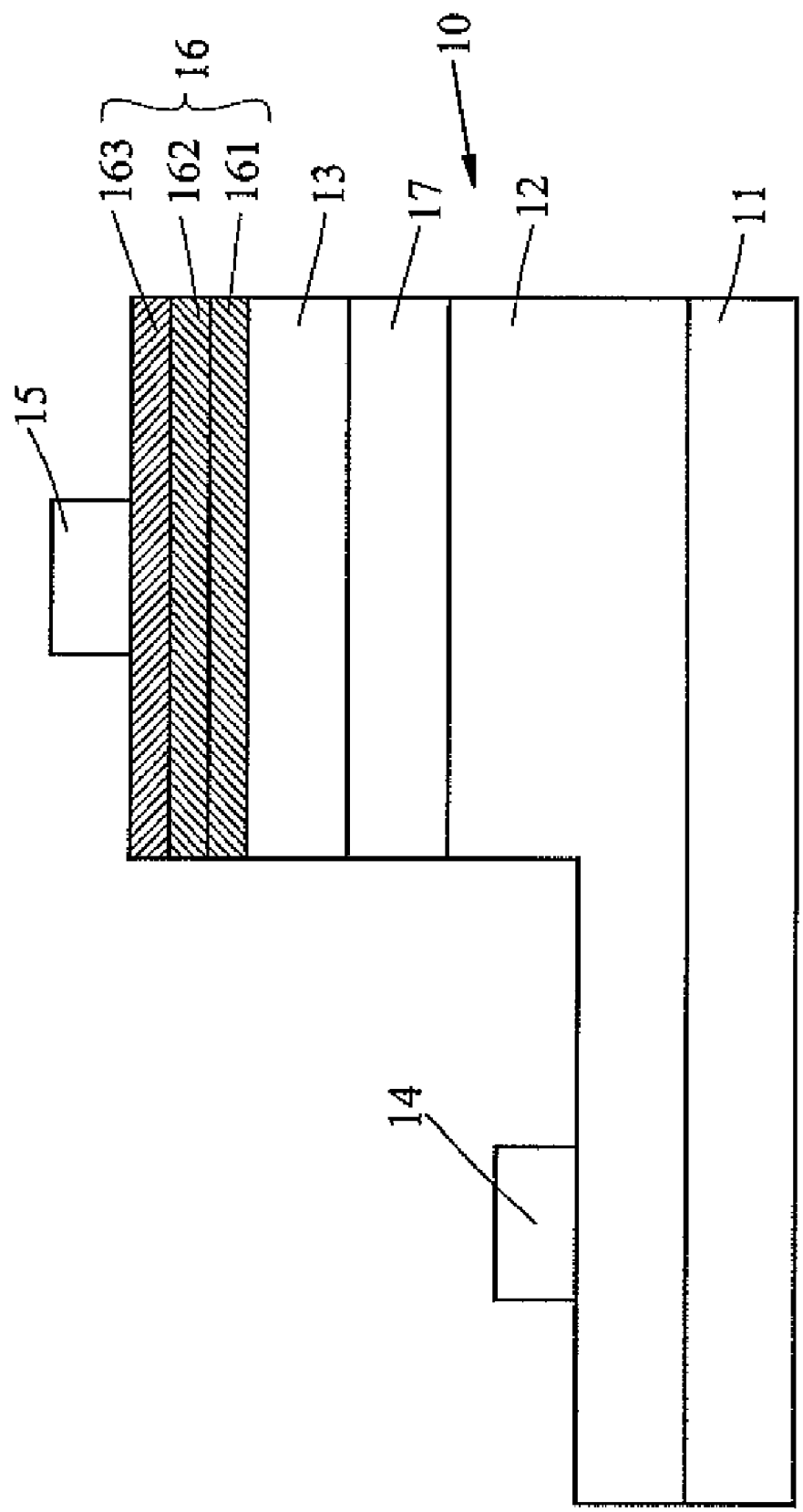
FIG. 2 is a view similar to FIG. 1 where an Au layer is formed on the Ag layer and a p-type metal electrode is attached onto the Au layer in a second step of the method.
Figure 3:
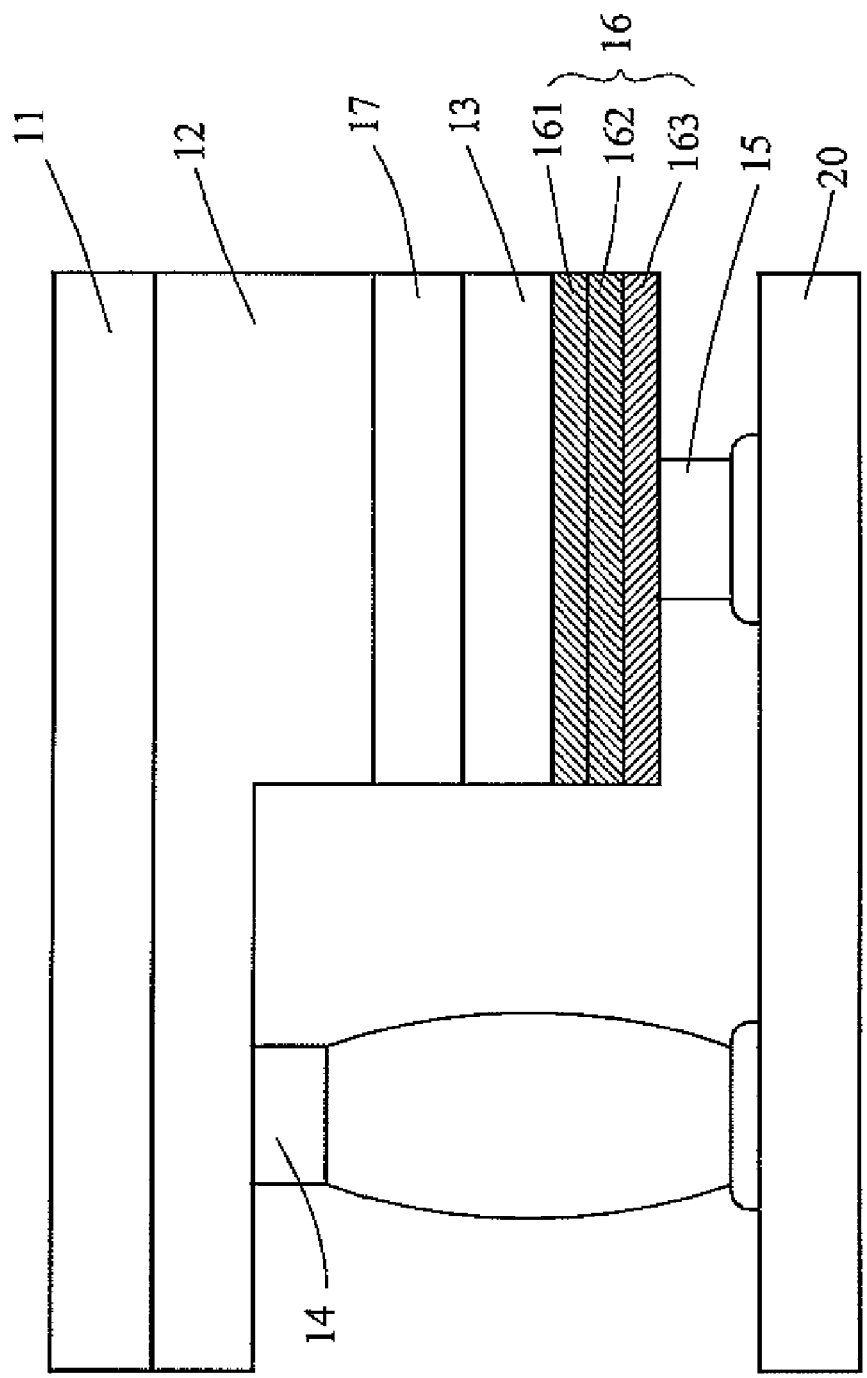
FIG. 3 is a schematic sectional view of the LED formed with an epitaxial layer in a third step of the method.

Referring to FIGS. 1 to 3, a method of manufacturing an LED 10 in accordance with a preferred embodiment of the invention is illustrated.

In a first step as illustrated in FIG. 1, a substrate 11 is formed. Next, an n-type GaN layer 12 is deposited on the substrate 11. Next, an active layer 17 is deposited on a portion of the n-type GaN layer 12, and an n-type metal electrode 14 is attached to another portion of the n-type GaN layer 12 respectively. The n-type metal electrode 14 is electrically connected to the n-type GaN layer 12. Next, a p-type GaN layer 13 is deposited on the active layer 17. Next, a transparent layer 161 is formed on the p-type GaN layer 13. Finally, an Ag layer 162 is formed on the transparent layer 161.

It is noted that the transparent layer 161 and the Ag layer 162 are annealed in a furnace. Next, the stacked transparent layer 161 and the Ag layer 162 are adhered on the p-type GaN layer 13.

In a second step as illustrated in FIG. 2, an Au layer 163 is coated on the Ag layer 162, and, thus, a metal reflector 16 is formed. Finally, a p-type metal electrode 15 is attached to the Au layer 163 and electrically connected thereto.

The transparent layer 161 is formed of nickel, tin oxide, indium tin oxide, zinc oxide, or zinc aluminum oxide. The transparent layer 161 has a thickness more than 1 μm. The annealing process is conducted in a temperature greater than 500° C. so as to form the transparent layer 161. Alternatively, the annealing process is conducted in a temperature less than 450° C. so as to form the transparent layer 161. Also, thickness of the Au layer 163 should be sufficiently large. Otherwise, the Au layer 163 may peel off when electrically connecting to another component.

In a third step as illustrated in FIG. 3, the produced LED is attached onto an epitaxial layer 20. The n-type metal electrode 14 is further electrically connected to the epitaxial layer 20, and the p-type metal electrode 15 is further electrically connected to the epitaxial layer 20, respectively.

As a result, light emitted from the active layer 17 passes through the transparent layer 161 and, then, impinges on the Ag layer 162. Finally, light is reflected from the Ag layer 162 to the active layer 17. Au is prevented from permeating the Ag layer 162, because only the transparent layer 161 and the Ag layer 162 are placed in the furnace in the annealing process. Hence, light reflection of the Ag layer 162 is not lowered adversely. As such, reflectivity of the metal reflector 16 is greatly increased. As a result, the produced LED has an increased light emission efficiency.

Figure 4:
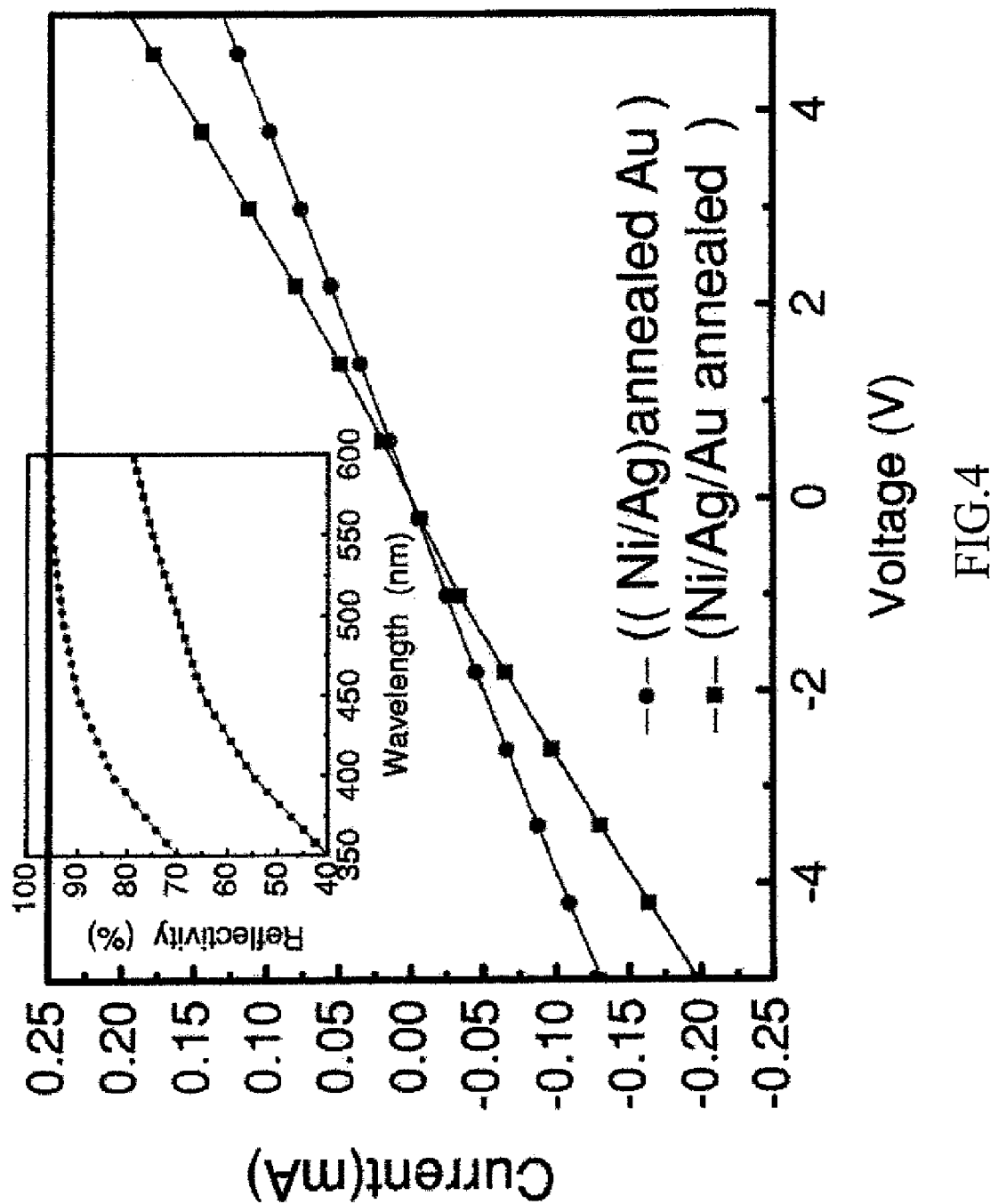
FIG. 4 is a diagram of Current-voltage (I-V) characteristics of (Ni/Ag)-annealed/Au and Ni/Ag/Au-annealed contacts at an annealing temperature of 500° C. for 10 minutes in $O_2$ ambient, wherein the inset shows the reflectivity of (Ni/Ag)-annealed/Au and Ni/Ag/Au-annealed contacts.
Figure 6:
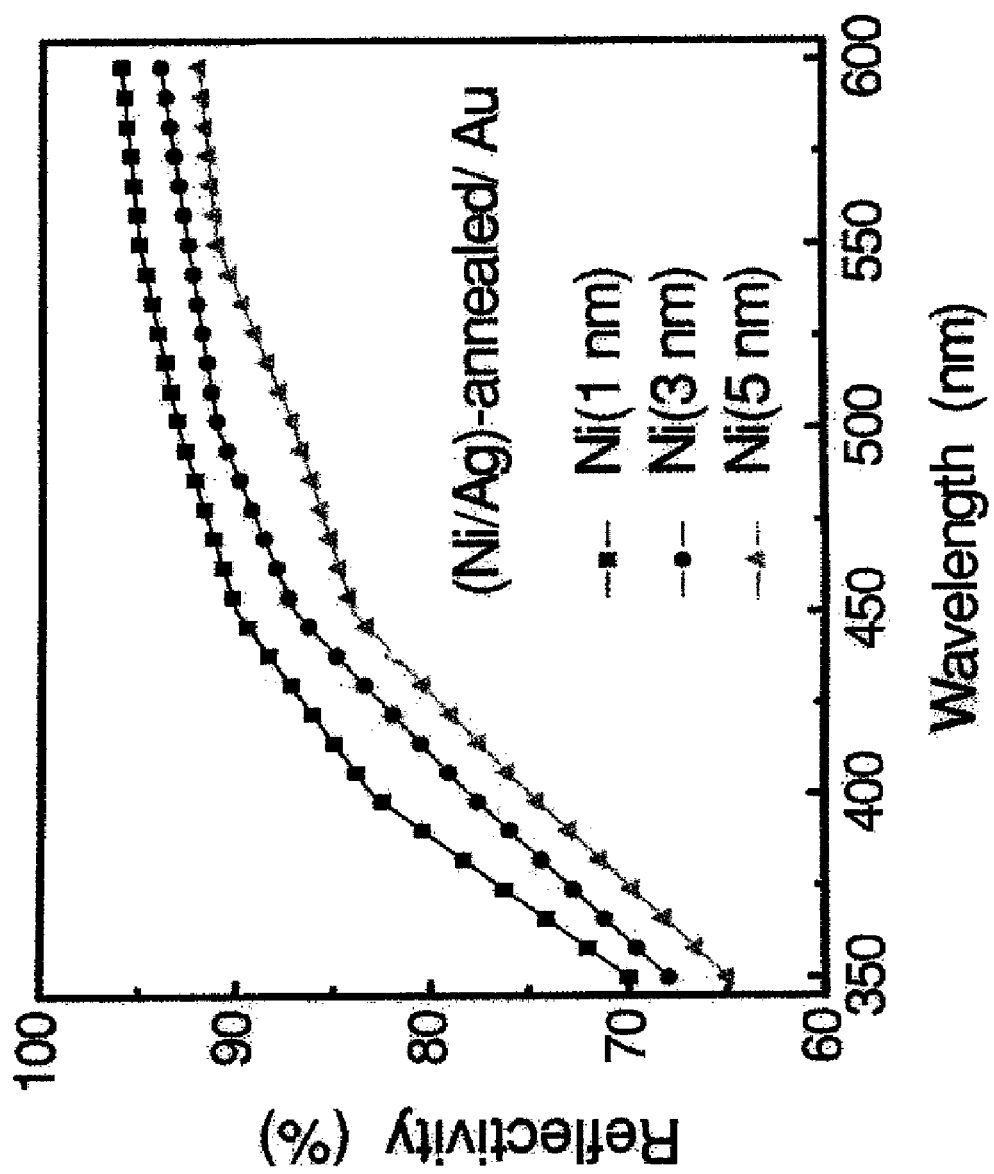
FIG. 6 is a diagram of Reflectivity of Ni/Ag)-annealed/Au contacts annealed at 500° C. for 10 minutes in an $O_2$ ambient.

FIG. 4 shows the current-voltage (I-V) characteristics of both (Ni/Ag)-annealed/Au samples at an annealing temperature of 500° C. for 10 minutes in $O_2$ ambient. The contact resistance of Ni/Ag/Au-annealed samples with a value of $4.35 \times 10^{-4}$ $\Omega cm^2$ is one order less than that of the (Ni/Ag)-annealed/Au contacts ($3.44 \times 10^{-3}$ $\Omega cm^2$). However, as shown in the inset of FIG. 6, reduced light reflectance (63%) of Ni/Ag/Au-annealed samples at a 465 nm wavelength is found to be 29% less compared to that of (Ni/Ag)-annealed/Au contacts (92%). It is known that Ag is an excellent material for metallic reflectors due to its high reflectivity in the visual light wavelength region. However, the strong interdiffusion of Ohmic metals and GaN in the Ni/Ag/Au-annealed samples resulted in poor reflectance. On the other hand, the (Ni/Ag)-annealed/Au samples have a slightly larger contact resistivity when compared to the Ni/Ag/Au-annealed contacts but exhibit higher reflectivity for the usage of FCLED.

Figure 5A:
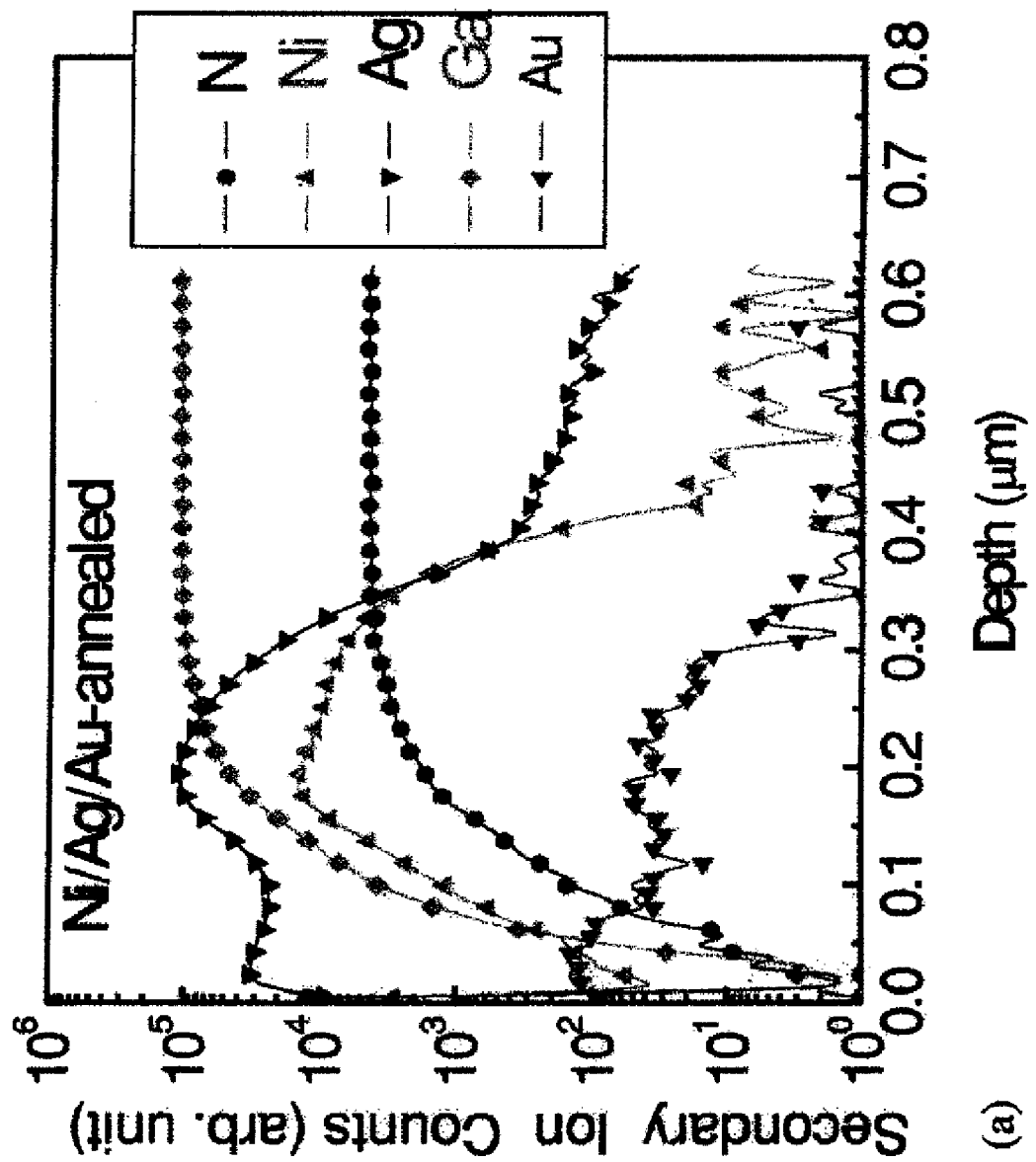
FIG. 5a is a diagram of SIMS depth profiles of (Ni/Ag)-annealed/Au.
Figure 5B:
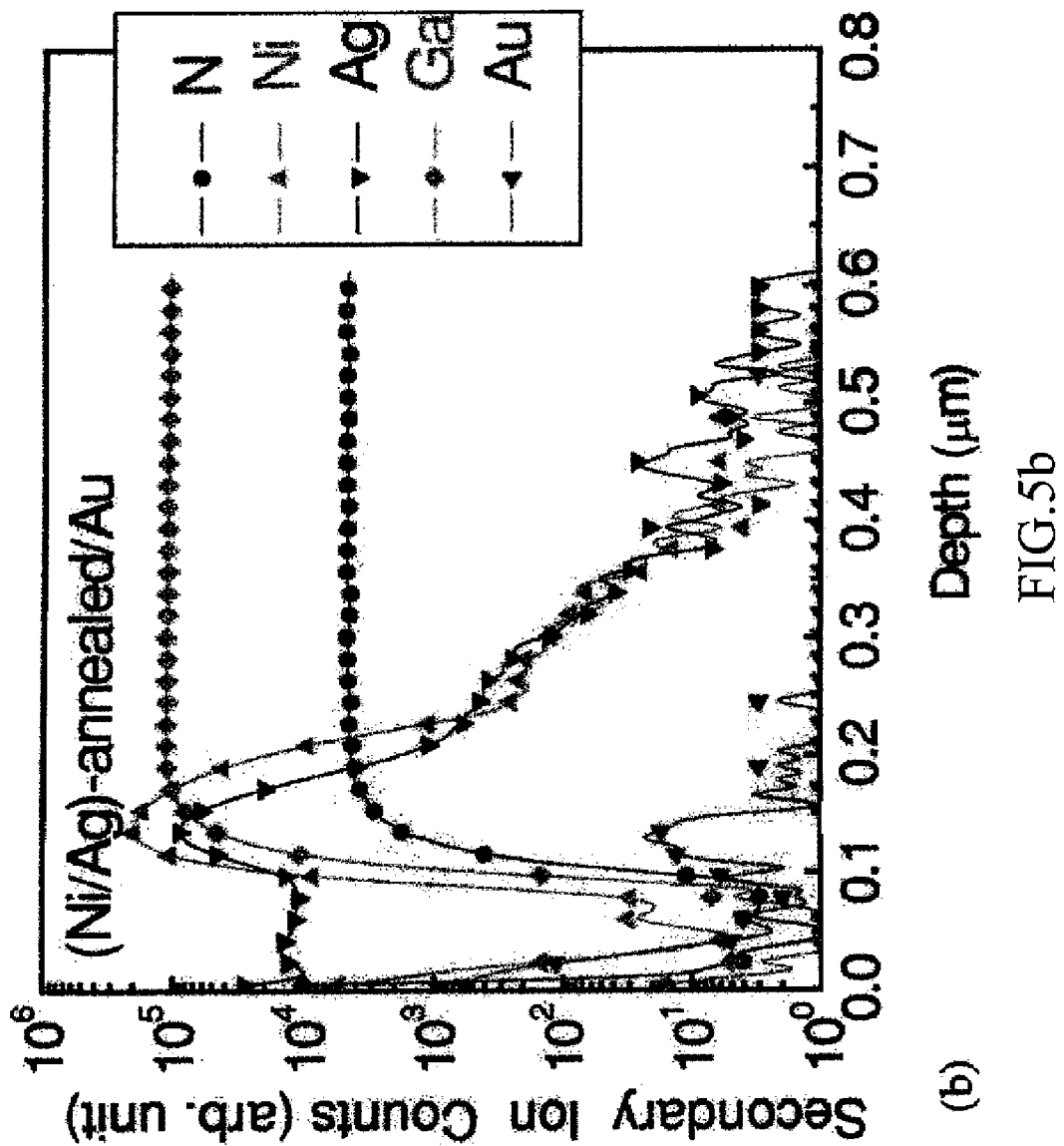
FIG. 5b is a diagram of SIMS depth profiles of (Ni/Ag/Au)-annealed contacts.

FIGS. 5a and 5b show the secondary ion mass spectrometry (SIMS) depth profiles of (Ni/Ag)-annealed/Au and Ni/Ag/Au-annealed contacts, respectively. It is observed that a strong interdiffusion of Ohmic metals and GaN occurs in the Ni/Ag/Au-annealed contacts but not in the (Ni/Ag)-annealed/Au contacts. Thus, the low reflectivity of the Ni/Ag/Au-annealed contacts can be attributed to the intermixing of Ni, Ag, Au metals.

Figure 7:
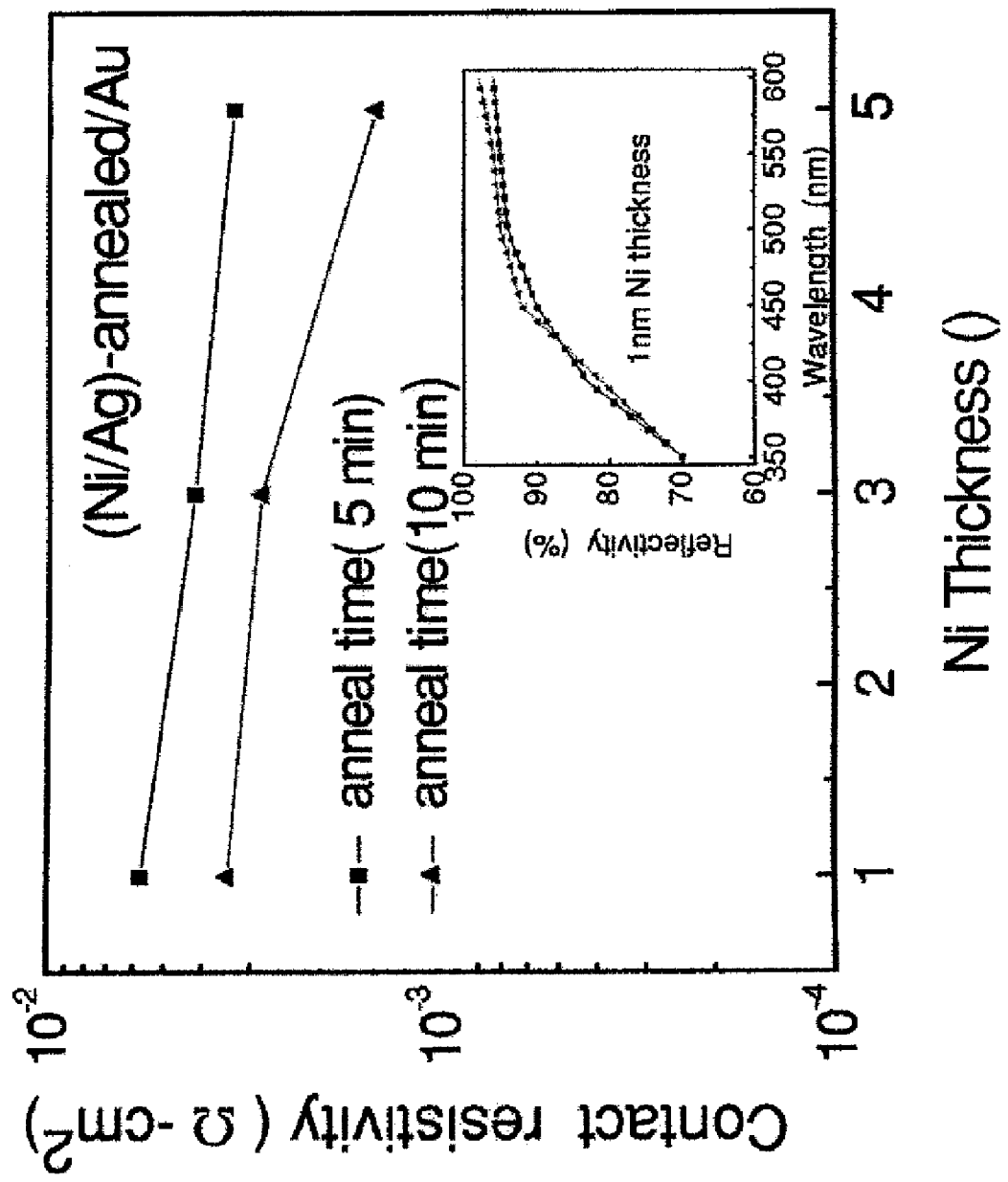
FIG. 7 is a diagram of Resistivity of (Ni/Ag)-annealed/Au contacts annealed at 500° C. for (a) 5 minutes, and (b) 10 minutes, wherein the inset shows the reflectivity of (Ni/Ag)-annealed/Au contacts.
Figure 8:
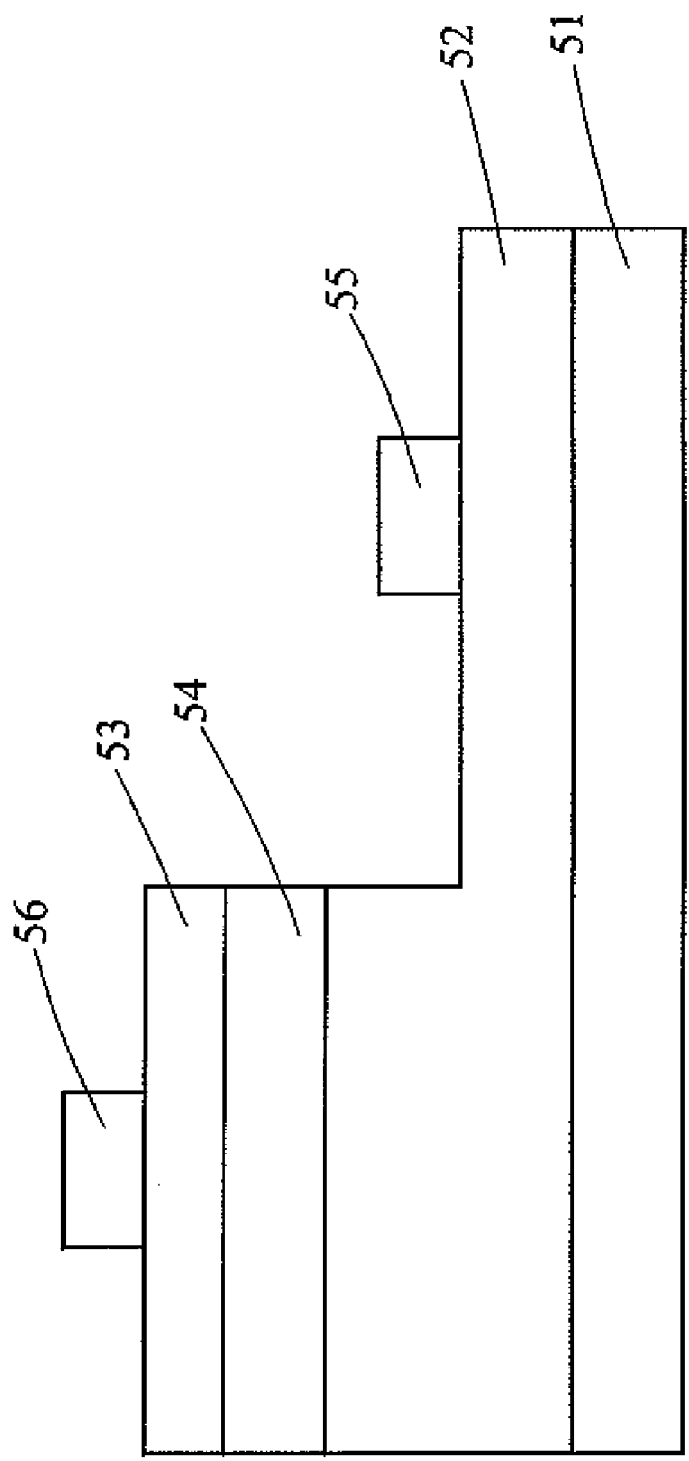
FIG. 8 is a schematic sectional view of a conventional LED.
Figure 9:
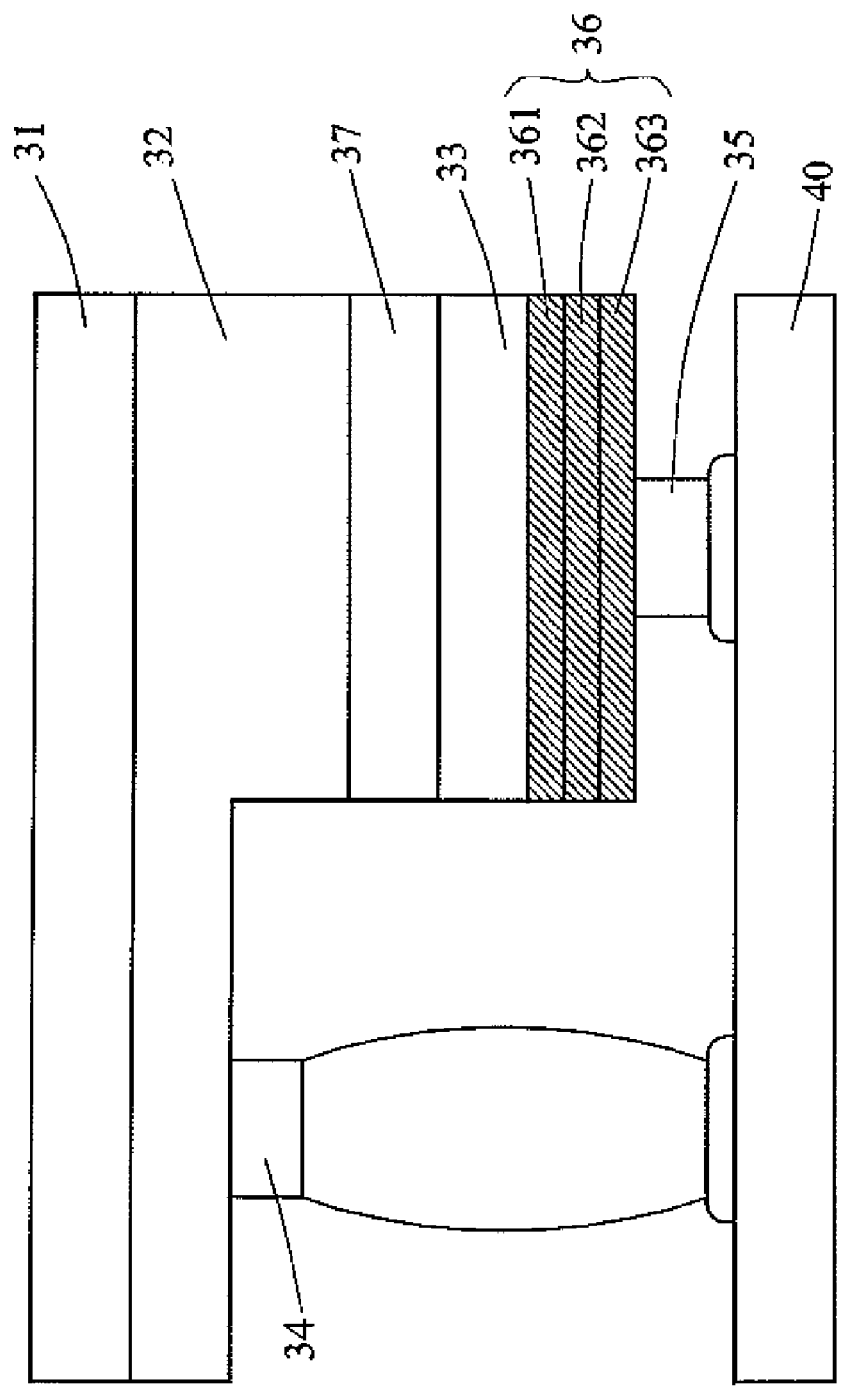
FIG. 9 is a schematic sectional view of another conventional LED formed with an epitaxial layer.

FIG. 6 shows the reflectivity of (Ni/Ag)-annealed/Au contacts annealed at 500° C. for 10 minutes in an $O_2$ ambient. Three different thicknesses of Ni, 1, 3, 5 nm, are examined. As shown in FIG. 6, the thicker the Ni thickness is, the lower the reflectance is. In addition, the resistivity of the proposed (Ni/Ag)-annealed/Au contacts is shown in FIG. 7, in which the (Ni/Ag) double layers with three different thickness of Ni, i.e., 1, 3, 5 nm, were annealed at an annealing temperature of 500° C. for both 5 and 10 minutes. The reflectivity of the Ohmic contact with 1 nm thickness of Ni is shown in the inset. The samples annealed for 10 minutes produced better Ni oxide/p-GaN contacts and resulted in lower resistivity than the samples annealed for 5 minutes.

In order to prepare these p-GaN FCLED reflective Ohmic contacts with the highest level of reflectivity and the lowest resistivity, it is suggested that the correspondent two step (Ni/Ag)-annealed/Au metallization process should have a thin Ni thickness (of 1 nm) and a proper Ni/Ag annealing time (of 10 min).

While the invention herein disclosed has been described by means of specific embodiments, numerous modifications and variations could be made thereto by those skilled in the art without departing from the scope and spirit of the invention set forth in the claims.

What is claimed is:

1. A method of manufacturing an LED comprising:
   forming a substrate;
   depositing an n-type GaN layer on the substrate;
   depositing an active layer on a first portion of the n-type GaN layer;
   attaching an n-type metal electrode to a second portion of the n-type GaN layer;
   depositing a p-type GaN layer on the active layer;
   forming a metal reflector on the p-type GaN layer;
   attaching a p-type metal electrode to the metal reflector; and
   attaching the p-type metal electrode and the n-type metal electrode to an epitaxial layer respectively,
   wherein the metal reflector comprises a transparent layer, an Ag layer, and an Au layer, and wherein the transparent layer and the Ag layer are formed by annealing in a furnace, and the Au layer is subsequently coated on the Ag layer, wherein the transparent layer and the Ag layer are annealed at an annealing temperature of 500° C. for 10 minutes in $O_2$ ambient.

2. The method of claim 1, wherein the transparent layer is formed of nickel.

3. The method of claim 2, wherein the transparent layer has a thickness of 1 nm.

4. The method of claim 1, wherein the transparent layer is formed of zinc oxide.

5. The method of claim 1, wherein the transparent layer is formed of zinc aluminum oxide.

6. The method of claim 1, wherein the transparent layer is formed of tin oxide.

7. The method of claim 1, wherein the transparent layer is formed of indium tin oxide.

* * * * *